(12) United States Patent
Zhang et al.

(10) Patent No.: US 11,367,557 B2
(45) Date of Patent: Jun. 21, 2022

(54) SEMICONDUCTOR CHIP HAVING ONE OR MORE ON-CHIP METAL WINDING AND ENCLOSED BY TOP AND BOTTOM CHIP-EXTERNAL FERROMAGNETIC CORES

(71) Applicant: International Business Machines Corporation, Armonk, NY (US)

(72) Inventors: Xin Zhang, Chappaqua, NY (US); Todd Edward Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 16/714,895

(22) Filed: Dec. 16, 2019

(65) Prior Publication Data
US 2021/0183560 A1    Jun. 17, 2021

(51) Int. Cl.
*H01L 23/00*    (2006.01)
*H01F 27/24*    (2006.01)
(Continued)

(52) U.S. Cl.
CPC ......... *H01F 27/24* (2013.01); *H01F 27/2804* (2013.01); *H01L 23/5227* (2013.01); *H01L 24/16* (2013.01); *H01L 25/0655* (2013.01); *H01L 28/10* (2013.01); *H01F 2027/2809* (2013.01); *H01L 2224/16227* (2013.01); *H01L 2924/19042* (2013.01)

(58) Field of Classification Search
CPC ................. H01F 27/24; H01F 27/2804; H01F 2027/2809; H01F 3/14; H01F 2017/0086; H01F 17/0006; H01F 2017/065; H01F 17/06; H01L 23/5227; H01L 24/16; H01L 25/0655; H01L 28/10; H01L 2224/16227; H01L 2924/19042
See application file for complete search history.

(56) References Cited

U.S. PATENT DOCUMENTS 5,747,870 A    5/1998  Pedder
6,441,715 B1   8/2002  Johnson
(Continued)

FOREIGN PATENT DOCUMENTS

JP    2008072021 A    3/2008

OTHER PUBLICATIONS

Hagita et al., "CMOS Switch Buck DC-DC Converter Fabricated in Organic Interposer with Embedded Zn—Fe Ferrite Core Inductor", Journal of the Magnetics Society of Japan, doi:10.3379/msjmag.1501R002, Jan. 28, 2015, 9 pages.
(Continued)

*Primary Examiner* — Ermias T Woldegeorgis
(74) *Attorney, Agent, or Firm* — Alexander G. Jochym

(57) ABSTRACT

The structure includes a semiconductor chip connected to a substrate via one or more solder balls. The semiconductor chip includes one or more on-chip metal winding. The structure includes a first ferromagnetic core. The first ferromagnetic core is located below the semiconductor chip and above the substrate. The structure includes a second ferromagnetic core. The second ferromagnetic core is located above the semiconductor chip. The first ferromagnetic core and the second ferromagnetic core create a magnetic loop.

20 Claims, 5 Drawing Sheets

(51) Int. Cl.
*H01L 25/065* (2006.01)
*H01L 49/02* (2006.01)
*H01L 23/522* (2006.01)
*H01F 27/28* (2006.01)

(56) References Cited

U.S. PATENT DOCUMENTS

| | | |
|---|---|---|
| 7,786,837 B2 | 8/2010 | Hebert |
| 7,884,452 B2 | 2/2011 | Feng et al. |
| 8,058,960 B2 * | 11/2011 | Hebert .................. H01L 23/645 |
| | | 336/200 |
| 9,035,421 B2 | 5/2015 | Song et al. |
| 10,056,182 B2 | 8/2018 | Murtagian et al. |
| 2013/0056847 A1 * | 3/2013 | Chen ....................... H01F 27/24 |
| | | 257/531 |
| 2014/0167900 A1 | 6/2014 | Murtagian et al. |

OTHER PUBLICATIONS

Sturcken et al., "A 2.5 D integrated voltage regulator using coupled-magnetic-core inductors on silicon interposer." IIEEE Journal of Solid-State Circuits, vol. 48, No. 1, Jan. 2013, 11 pages.

\* cited by examiner

SEMICONDUCTOR CHIP HAVING ONE OR MORE ON-CHIP METAL WINDING AND ENCLOSED BY TOP AND BOTTOM CHIP-EXTERNAL FERROMAGNETIC CORES

BACKGROUND

The present invention relates generally to the field of semiconductors, and more particularly to flip chip semiconductor chips with chip-external magnetic cores.

A flip chip, or also known as a controlled collapse chip connection (C4), is a method of interconnecting semiconductor devices (e.g., integrated circuit chips and microelectromechanical systems), to external circuitry with solder bumps that have been deposited onto the chip pads. The solder bumps are deposited on the chip pads on the top side of the wafer during the final wafer processing steps. The chip is flipped over so that the top side faces down in order to mount the chip to external circuitry so that the flip chips pads align with matching pads on the external circuit. The solder is reflowed to complete the interconnect.

Processing a flip chip is similar to conventional integrated circuit fabrication. However, near the end of manufacturing, the attachment pads are metalized to make them receptive to solder. The semiconductor chips are then cut out of the wafer as normal. The chip is flipped, and the solder dots are brought down onto connectors on the underlying substrate, such as a circuit board. The resulting completed flip chip assembly is much smaller than a traditional carrier-based system and the chip sits directly on the circuit board, thus being small than the carrier both in area and height.

SUMMARY

Embodiments of the present invention include a structure. In an embodiment, the structure includes a semiconductor chip connected to a substrate via one or more solder balls. The semiconductor chip includes one or more on-chip metal winding. The structure includes a first ferromagnetic core. The first ferromagnetic core is located below the semiconductor chip and above the substrate. The structure includes a second ferromagnetic core. The second ferromagnetic core is located above the semiconductor chip. The first ferromagnetic core and the second ferromagnetic core create a magnetic loop.

DETAILED DESCRIPTION

Figure 1:
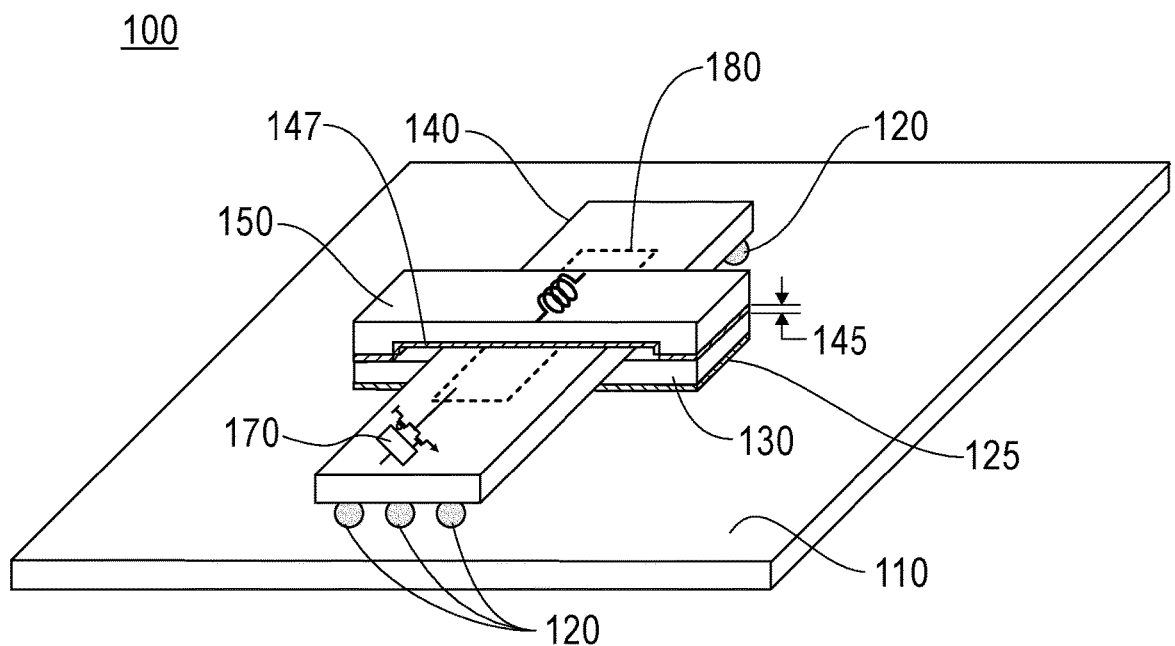
FIG. 1 is a perspective view of a semiconductor chip with chip-external magnetic cores, generally designated 100, in accordance with a first embodiment of the invention.

Conventional discrete magnetic devices (i.e., power inductors) are bulky and hard to be integrated in substrate level or semiconductor chip level. Additionally, conventional magnetic film power inductors on a semiconductor chip is a fully integrated salutation on semiconductor chips, however this involves modifying the chip fabrication process and introduces high costs in the manufacturing.

Embodiments of the present invention provide for a structure and method to assemble flip chip semiconductor chips with chip-external magnetic cores. Embodiments of the present invention provide for magnetic cores made of ferromagnetic metal, such as iron, or ferrimagnetic compounds such as ferrites. Embodiments of the present invention provide for high permeability, relative to the surrounding air, which causes the magnetic field lines to be concentrated in the core of the material. Embodiments of the present invention provide of chip-external magnetic cores and the on semiconductor chip metal layers together that make magnetic devices that may be used by the semiconductor chip or other devices.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Reference is now made to FIGS. 1-8, which illustrate multiple embodiments of a structure and methods to assemble a flip chip semiconductor chip with chip-external magnetic cores.

Referring to FIG. 1, is a perspective view of a semiconductor chip with chip-external magnetic cores, generally designated 100, in accordance with a first embodiment of the invention. FIG. 1 depicts a substrate 110 attached to semiconductor chip 140 via one or more solder ball(s) 120. In an embodiment, substrate 110 may be circuit board, mother board, or any other substrate known in the art to connect a semiconductor chip 140. In an embodiment, one or more solder ball(s) 120 are used to attach the semiconductor chip 140 to the substrate 110. In an alternative embodiment, any other connecting structure or device known in the art may be used to connect the semiconductor chip 140 to the substrate 110. In an embodiment, the one or more solder ball(s) 120 are spaced to allow a lower ferromagnetic core 130 to be located in a cavity underneath the semiconductor chip 140 and above the substrate 110. In an embodiment, substrate 110 may include a driver 170 that controls the on-chip metal winding 180.

In a first embodiment, FIG. 1 depicts a semiconductor chip 140 that includes on-chip metal winding 180. On-chip metal winding 180 may be metal shapes made by semiconductor back-end-of-line metals. The on-chip metal winding 180 are commonly metals, for example copper and aluminum. The on-chip metal winding 180 may be in the back-end-of-line part of fabrication state that may include, but not limited to, contacts (pads), interconnect wires, visa and dielectric structures that are formed. In an embodiment, there may be any number of on-chip metal winding 180. For example, there may be 10 or more metal layers in the on-chip metal winding 180. In an embodiment, the on-chip metal winding 180 is located on a first side, or bottom, of the semiconductor chip 140. In an alternative embodiment, the on-chip metal winding 180 may be located anywhere in semiconductor chip 140. In an embodiment, as discussed previously, a driver 170 controls the on-chip metal winding 180. In an embodiment, the driver 170 may be attached to the substrate 110 or any other surface (not shown).

In a first embodiment, as shown in FIG. 1, a lower ferromagnetic core 130 is located in a cavity underneath the semiconductor chip 140 and above the substrate 110. In an embodiment, the lower ferromagnetic core 130 is attached directly to substrate 110 by glue, non-conductive material 125 covering substrate 110, or any other means known in the art which causes the space shown between the lower ferromagnetic core 130 and substrate 110. In a first embodiment, as shown in FIG. 1, an upper ferromagnetic core 150 is mounted on top of the semiconductor chip 140. In an embodiment, a non-magnetic non-conductive material 147, for example, Kapton tape or glue, is located between at least some of the gap between the upper ferromagnetic core 150 and the lower ferromagnetic core 130 and/or semiconductor chip 140. In an alternative embodiment, no materials exist between the upper ferromagnetic core 150 and the lower ferromagnetic core 130 and the semiconductor chip 140 causing there to be no air gap 145 (not shown). In an embodiment, the upper ferromagnetic core 150 is "U" shaped and inverted to have the two limbs of the "U" facing downwards towards the lower ferromagnetic core 130. In an embodiment, the lower ferromagnetic core 130 and the upper ferromagnetic core 150 create a magnetic loop together. In an embodiment, an air gap 145 is located between the two limbs of the upper ferromagnetic core 150 and the lower ferromagnetic core 130. In an embodiment, the lower ferromagnetic core 130 and the upper ferromagnetic core 150 may be, but is not limited to, a ferromagnetic metal, such as iron, or a ferrimagnetic compound such as ferrites. In an embodiment, the lower ferromagnetic core 130 and the upper ferromagnetic core 150 may be machined from a magnetic material. In an embodiment, the lower ferromagnetic core 130 and the upper ferromagnetic core 150 create a magnetic loop together.

Figure 2:
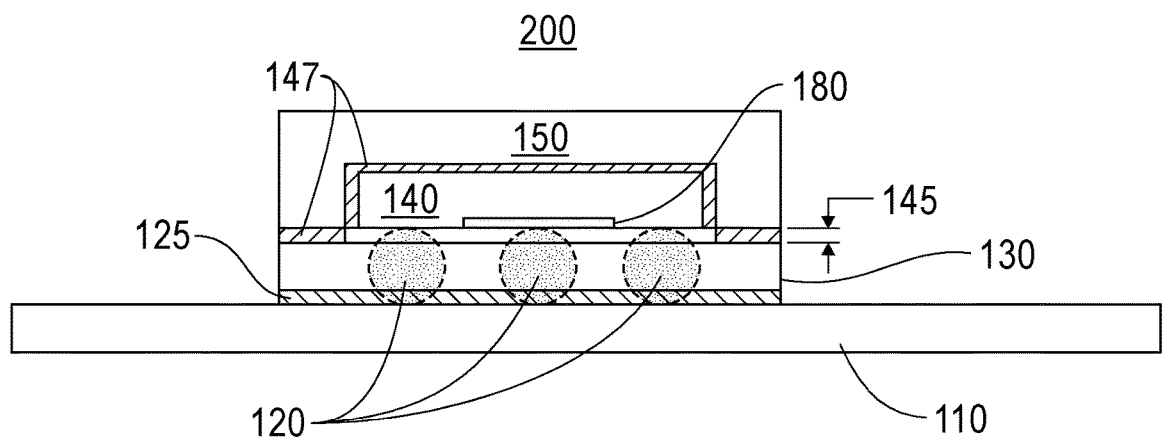
FIG. 2 is a pictorial representation (through a cross-sectional view) depicting the semiconductor chip with chip-external magnetic cores of FIG. 1, generally designated 200, in accordance with a first embodiment of the invention.

Referring to FIG. 2, there is a pictorial representation (through a cross-sectional view) depicting the semiconductor chip with chip-external magnetic cores of FIG. 1, generally designated 200, in accordance with a first embodiment of the invention. FIG. 2 depicts a substrate 110 attached to semiconductor chip 140 via one or more solder ball(s) 120. In an embodiment, an on-chip metal winding 180 is located on a first side, or bottom, of the semiconductor chip 140. On-chip metal winding 180 may be metal shapes made by semiconductor back-end-of-line metals. The on-chip metal winding 180 are commonly metals, for example copper and aluminum. The on-chip metal winding 180 may be in the back-end-of-line part of fabrication state that may include, but not limited to, contacts (pads), interconnect wires, visa and dielectric structures that are formed. In an embodiment, there may be any number of on-chip metal winding 180. For example, there may be 10 or more metal layers in the on-chip metal winding 180. In an embodiment, the on-chip metal winding 180 is located on a first side, or bottom, of the semiconductor chip 140. In an alternative embodiment, the on-chip metal winding 180 may be located anywhere in semiconductor chip 140. In an embodiment, a lower ferromagnetic core 130 is located in a cavity underneath the semiconductor chip 140 and above the substrate 110. In an embodiment, an upper ferromagnetic core 150 is mounted on top of the semiconductor chip 140. In an embodiment, an air gap 145 is located between the two limbs of the upper ferromagnetic core 150 and the lower magnetic core 130. In an alternative embodiment, lower ferromagnetic core 130 may be in direct contact (not shown) with substrate 110.

Figure 3:
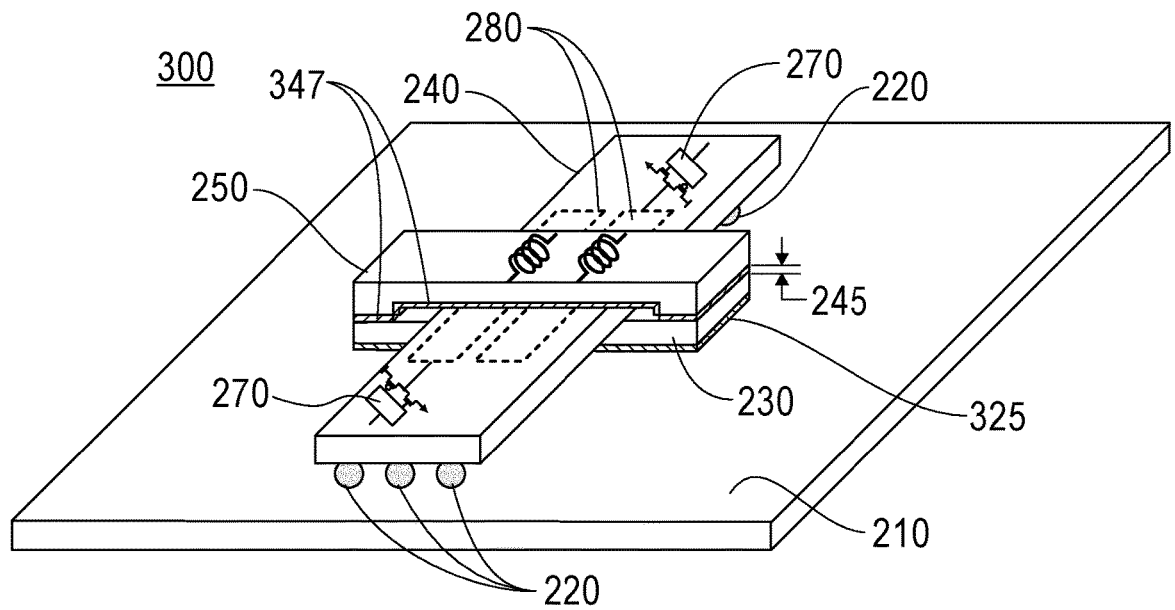
FIG. 3 is a perspective view of a semiconductor chip with chip-external magnetic cores, generally designated 300, in accordance with a second embodiment of the invention.

Referring to FIG. 3 is a perspective view of a semiconductor chip with chip-external magnetic cores, generally designated 300, in accordance with a second embodiment of the invention. FIG. 3 depicts a substrate 210 attached to semiconductor chip 240 via one or more solder ball(s) 220. In an embodiment, substrate 210 may be circuit board, mother board, or any other substrate known in the art to connect a semiconductor chip 240. In an embodiment, one or more solder ball(s) 220 are used to attach the semiconductor chip 240 to the substrate 210. In an alternative embodiment, any other connecting structure or device known in the art may be used to connect the semiconductor chip 240 to the substrate 210. In an embodiment, the one or more solder ball(s) 220 are spaced to allow a lower ferromagnetic core 230 to be located in a cavity underneath the semiconductor chip 240 and above the substrate 210. In an embodiment, substrate 210 may include one or more driver 270 that controls the two or more on-chip metal winding 280.

In a second embodiment, FIG. 3 depicts a semiconductor chip 140 that includes two or more on-chip metal winding 280. The two or more on-chip metal winding 280 may be metal shapes made by semiconductor back-end-of-line metals. The two or more on-chip metal winding 280 are commonly metals, for example copper and aluminum. The two or more on-chip metal winding 280 may be in the back-end-of-line part of fabrication state that may include, but not limited to, contacts (pads), interconnect wires, visa and dielectric structures that are formed. In an embodiment, the two or more on-chip metal winding 280 are located on a first side, or bottom, of the semiconductor chip 240. In an alternative embodiment, the two or more on-chip metal winding 280 may be located anywhere in semiconductor chip 240. In an embodiment, each of the two or more on-chip metal winding 280 may be the same size. In an alternative embodiment, each of the two or more on-chip metal winding 280 may be different sizes. In an embodiment, as discussed previously, one or more driver 270 controls the two or more on-chip metal winding 280. In an embodiment, the one or more driver 270 may be attached to the substrate 210 or any other surface (not shown).

In a second embodiment, as shown in FIG. 3, a lower ferromagnetic core 230 is located in a cavity underneath the semiconductor chip 240 and above the substrate 210. In an embodiment, the lower ferromagnetic core 230 is attached directly to substrate 210 by glue, non-conductive material 225 covering substrate 210, or any other means known in the art which causes the space shown between the lower ferromagnetic core 230 and substrate 210. In a second embodiment, as shown in FIG. 3, an upper ferromagnetic core 250 is mounted on top of the semiconductor chip 240. In an embodiment, a non-magnetic non-conductive material 247, for example, Kapton tape or glue, is located between at least some of the gap between the upper ferromagnetic core 250 and the lower ferromagnetic core 230 and/or semiconductor chip 240. In an alternative embodiment, no materials exist between the upper ferromagnetic core 150 and the lower ferromagnetic core 230 and the semiconductor chip 240 causing there to be no air gap 245 (not shown). In an embodiment, the upper ferromagnetic core 250 is "U" shaped and inverted to have the two limbs of the "U" facing downwards towards the lower ferromagnetic core 230. In an embodiment, the lower ferromagnetic core 230 and the upper ferromagnetic core 250 create a magnetic loop together. In an embodiment, an air gap 245 is located between the two limbs of the upper ferromagnetic core 250 and the lower magnetic core 230. In an embodiment, the lower ferromagnetic core 230 and the upper ferromagnetic core 250 may be, but is not limited to, a ferromagnetic metal, such as iron, or a ferrimagnetic compound such as ferrites. In an embodiment, the lower ferromagnetic core 230 and the upper ferromagnetic core 250 may be machined from a magnetic material. In an embodiment, the lower ferromagnetic core 230 and the upper ferromagnetic core 250 create a magnetic loop together.

Figure 4:
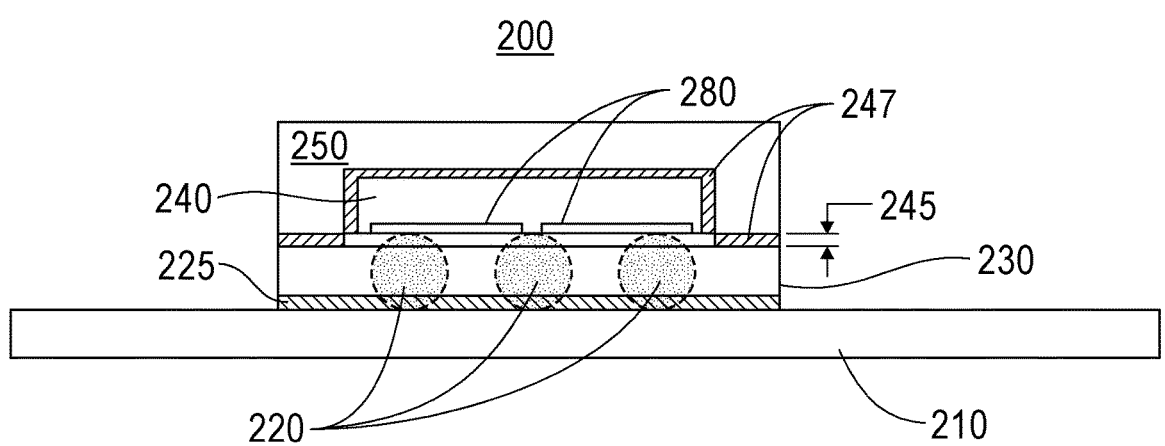
FIG. 4 is a pictorial representation (through a cross-sectional view) depicting the semiconductor chip with chip-external magnetic cores of FIG. 3, generally designated 400, in accordance with a second embodiment of the invention.

Referring to FIG. 4 there is a pictorial representation (through a cross-sectional view) depicting the semiconductor chip with chip-external magnetic cores of FIG. 3, generally designated 400, in accordance with a second embodiment of the invention. FIG. 4 depicts a substrate 210 attached to semiconductor chip 240 via one or more solder ball(s) 220. In an embodiment, two or more on-chip metal winding 280 are located on a first side, or bottom, of the semiconductor chip 240. In an embodiment, any number of the two or more on-chip metal winding 380 may be located horizontally next to each other, as shown in FIG. 4. In an embodiment, a lower ferromagnetic core 230 is located in a cavity underneath the semiconductor chip 240 and above the substrate 210. In an embodiment, an upper ferromagnetic core 250 is mounted on top of the semiconductor chip 240. In an embodiment, an air gap 245 is located between the two limbs of the upper ferromagnetic core 250 and the lower magnetic core 230. In an alternative embodiment, lower ferromagnetic core 230 may be in direct contact (not shown) with substrate 210.

Figure 5:
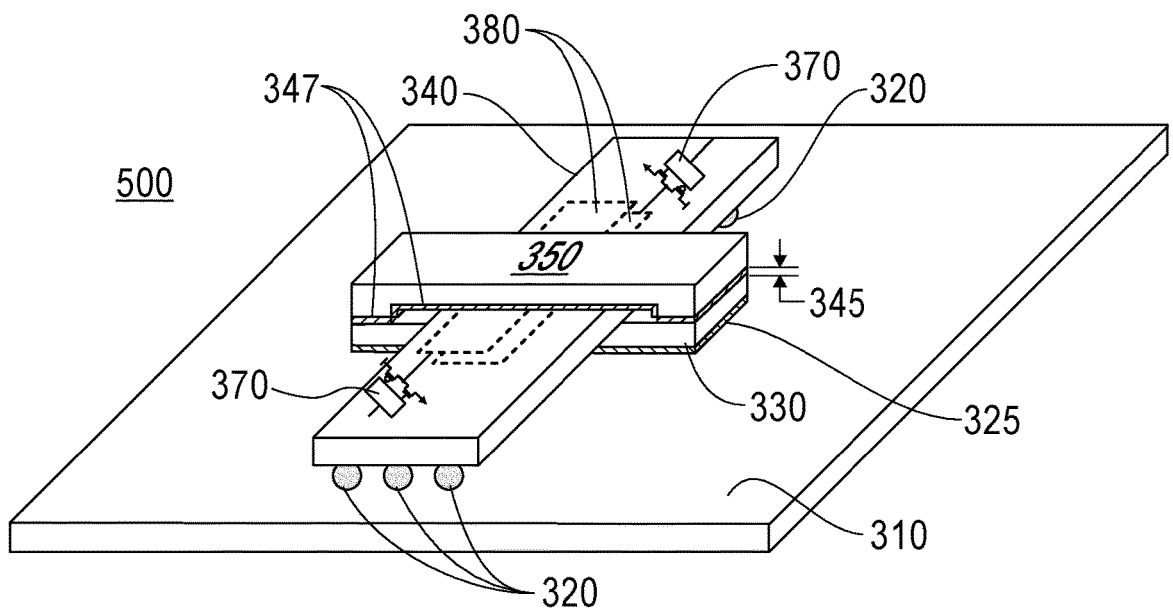
FIG. 5 is a perspective view of a semiconductor chip with chip-external magnetic cores, generally designated 500, in accordance with a third embodiment of the invention.

Referring to FIG. 5 is a perspective view of a semiconductor chip with chip-external magnetic cores, generally designated 500, in accordance with a third embodiment of the invention. FIG. 5 depicts a substrate 310 attached to semiconductor chip 340 via one or more solder ball(s) 320. In an embodiment, substrate 310 may be circuit board, mother board, or any other substrate known in the art to connect a semiconductor chip 340. In an embodiment, one or more solder ball(s) 320 are used to attach the semiconductor chip 340 to the substrate 310. In an alternative embodiment, any other connecting structure or device known in the art may be used to connect the semiconductor chip 340 to the substrate 310. In an embodiment, the one or more solder ball(s) 320 are spaced to allow a lower ferromagnetic core 330 to be located in a cavity underneath the semiconductor chip 340 and above the substrate 310. In an embodiment, substrate 310 may include one or more driver 370 that controls the two or more on-chip metal winding 380.

In a third embodiment, FIG. 5 depicts a semiconductor chip 340 that includes two or more on-chip metal winding 380. The two or more on-chip metal winding 380 may be metal shapes made by semiconductor back-end-of-line metals. The two or more on-chip metal winding 380 are commonly metals, for example copper and aluminum. The two or more on-chip metal winding 380 may be in the back-end-of-line part of fabrication state that may include, but not limited to, contacts (pads), interconnect wires, visa and dielectric structures that are formed. In an embodiment, the first of the two or more on-chip metal winding 380 are located on a first side, or bottom, of the semiconductor chip 340. The second, and any subsequent, of the two or more on-chip metal winding 380 are located above the first, or any previous, on-chip metal winding and farther away from the first of the two or more on-chip metal winding 380. In an embodiment, each of the two or more on-chip metal winding 380 may be the same size. In an alternative embodiment, each of the two or more on-chip metal winding 380 may be different sizes. In an embodiment, each of the two or more on-chip metal winding 380 may be spaced based on the chip manufacturing technology used. For example, the spacing may be between 100 nanometers (nm) to 5000 nm. In an embodiment, as discussed previously, one or more driver 370 controls the two or more on-chip metal winding 380. In an embodiment, the one or more driver 370 may be attached to the substrate 310 or any other surface (not shown).

In a third embodiment, as shown in FIG. 5 a lower ferromagnetic core 330 is located in a cavity underneath the semiconductor chip 340 and above the substrate 310. In an embodiment, the lower ferromagnetic core 330 is attached directly to substrate 310 by glue, non-conductive material 325 covering substrate 310, or any other means known in the art which causes the space shown between the lower ferromagnetic core 330 and substrate 310. In a third embodiment, as shown in FIG. 5, an upper ferromagnetic core 350 is mounted on top of the semiconductor chip 340. In an embodiment, a non-magnetic non-conductive material 347, for example, Kapton tape or glue, is located between at least some of the gap between the upper ferromagnetic core 350 and the lower ferromagnetic core 330 and/or semiconductor chip 340. In an alternative embodiment, no materials exist between the upper ferromagnetic core 350 and the lower ferromagnetic core 330 and the semiconductor chip 340 causing there to be no air gap 345 (not shown). In an embodiment, the upper ferromagnetic core 350 is "U" shaped and inverted to have the two limbs of the "U" facing downwards towards the lower ferromagnetic core 330. In an embodiment, the lower ferromagnetic core 330 and the upper ferromagnetic core 350 create a magnetic loop together. In an embodiment, an air gap 345 is located between the two limbs of the upper ferromagnetic core 350 and the lower magnetic core 330. In an embodiment, the lower ferromagnetic core 330 and the upper ferromagnetic core 350 may be, but is not limited to, a ferromagnetic metal, such as iron, or a ferrimagnetic compound such as ferrites. In an embodiment, the lower ferromagnetic core 330 and the upper ferromagnetic core 350 may be machined from a magnetic material. In an embodiment, the lower ferromagnetic core 330 and the upper ferromagnetic core 350 create a magnetic loop together.

Figure 6:
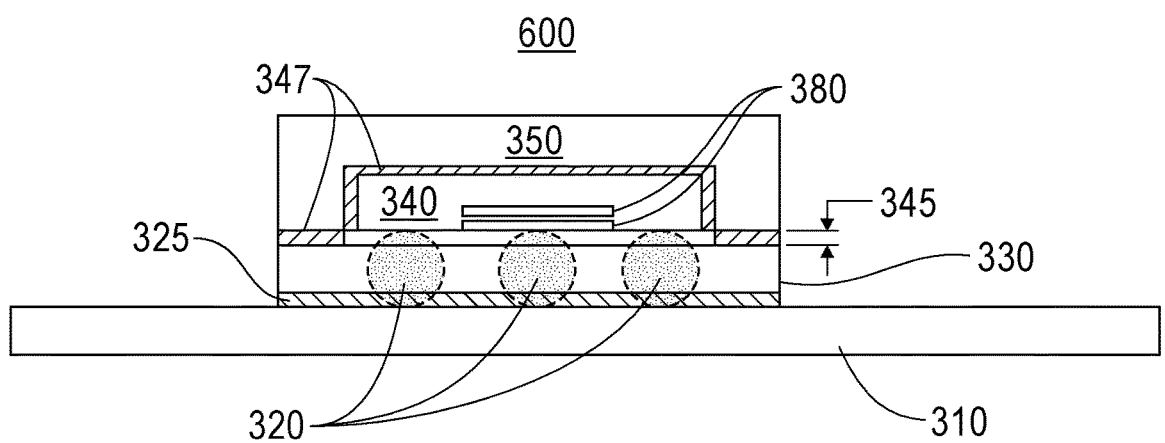
FIG. 6 is a pictorial representation (through a cross-sectional view) depicting the semiconductor chip with chip-external magnetic cores of FIG. 5, generally designated 600, in accordance with a third embodiment of the invention.

Referring to FIG. 6 there is a pictorial representation (through a cross-sectional view) depicting the semiconductor chip with chip-external magnetic cores of FIG. 5, generally designated 600, in accordance with a third embodiment of the invention. FIG. 6 depicts a substrate 310 attached to semiconductor chip 340 via one or more solder ball(s) 320. In an embodiment, a first of two or more on-chip metal winding 380 are located on a first side, or bottom, of the semiconductor chip 240. In an embodiment, the second of two or more on-chip metal winding 380 are located above the first of the two or more on-chip metal winding 380. In an embodiment, any number of on-chip metal winding 380 may be stacked on top of each other For example, in modern integrated circuit process, there may be more than 10 on-chip metal winding 380 added in the back-end-of-line metals. In an embodiment, a lower ferromagnetic core 330 is located in a cavity underneath the semiconductor chip 340 and above the substrate 310. In an embodiment, an upper ferromagnetic core 350 is mounted on top of the semiconductor chip 340. In an embodiment, an air gap 345 is located between the two limbs of the upper ferromagnetic core 350 and the lower magnetic core 330. In an alternative embodiment, lower ferromagnetic core 330 may be in direct contact (not shown) with substrate 310.

Figure 7:
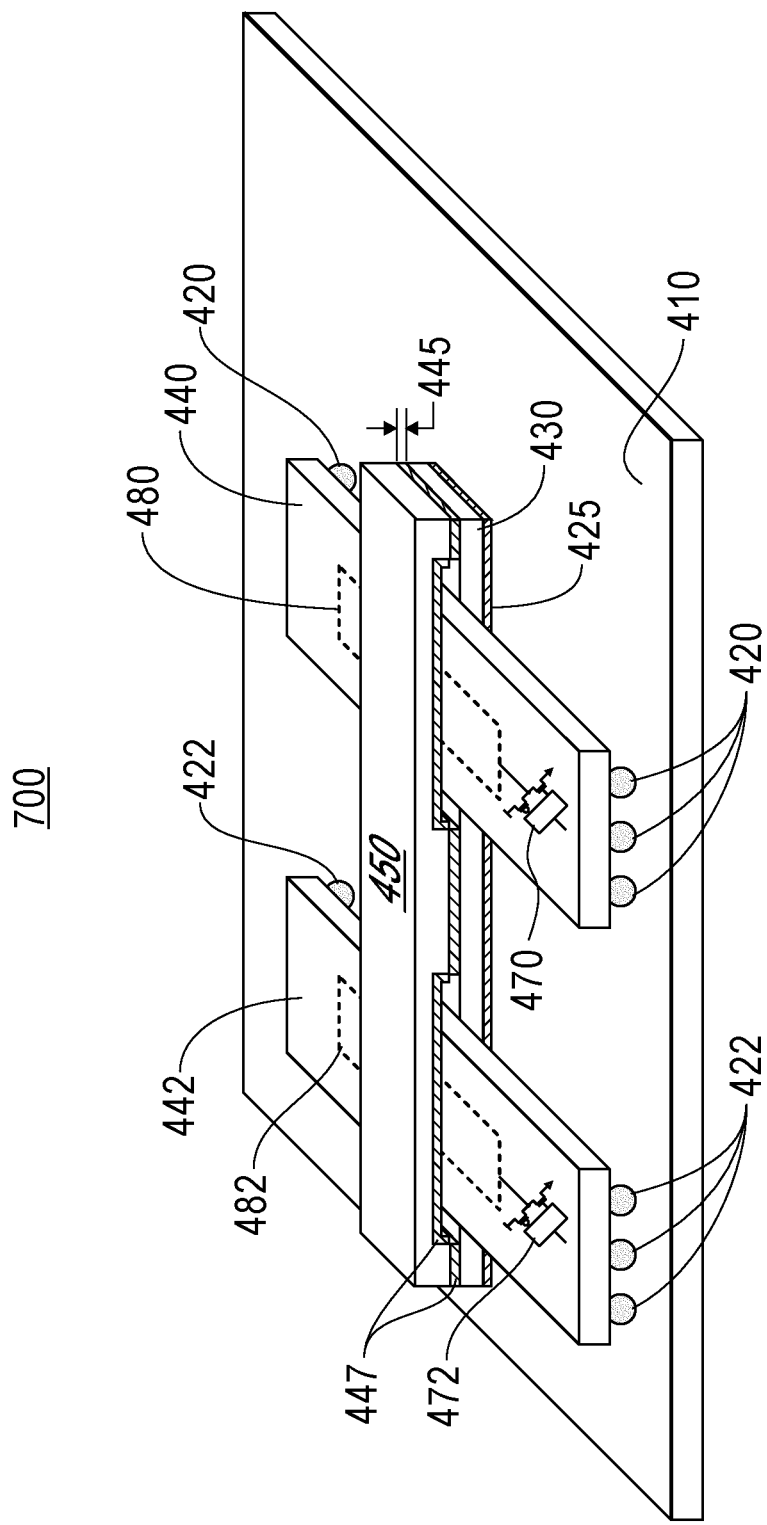
FIG. 7 is a perspective view of two semiconductor chips with chip-external magnetic cores, generally designated 700, in accordance with a fourth embodiment of the invention.

Referring to FIG. 7 is a perspective view of a semiconductor chip with chip-external magnetic cores, generally designated 700, in accordance with a fourth embodiment of the invention. FIG. 7 depicts a substrate 410 attached to a first semiconductor chip 440 and a second semiconductor chip 442 via one or more solder ball(s) 420 and one or more solder ball(s) 422, respectively. In an embodiment, substrate 410 may be circuit board, mother board, or any other substrate known in the art to connect a first semiconductor chip 440 and a second semiconductor chip 442. In an embodiment, the one or more solder ball(s) 420 and one or more solder ball(s) 422 are used to attach the first semiconductor chip 440 and a second semiconductor chip 442, respectively, to the substrate 310. In an alternative embodiment, any other connecting structure or device known in the art may be used to connect the first semiconductor chip 440 and a second semiconductor chip 442 to the substrate 410. In an embodiment, the one or more solder ball(s) 420 and one or more solder ball(s) 422 are spaced to allow a lower ferromagnetic core 430 to be located in a cavity underneath the first semiconductor chip 440 and a second semiconductor chip 442 and above the substrate 410. In an embodiment, substrate 410 may include one or more first driver 470 and one or more second driver 472 that controls the two or more first on-chip metal winding 480 and the two or more second on-chip metal winding 482, respectively.

In a fourth embodiment, FIG. 7 depicts a first semiconductor chip 440 that includes two or more first on-chip metal winding 480 and a second semiconductor chip 442 that includes two or more second on-chip metal winding 482. In an embodiment, the two or more first on-chip metal winding 480 are located on a first side, or bottom, of the first semiconductor chip 440. In an embodiment, the two or more second on-chip metal winding 482 are located on a first side, or bottom, of the second semiconductor chip 442. In an embodiment, as discussed previously, one or more first driver 470 controls the two or more first on-chip metal winding 480. In an embodiment, as discussed previously, one or more second driver 472 controls the two or more second on-chip metal winding 482. In an embodiment, the one or more first driver 470 may be attached to the substrate 410 or any other surface (not shown). In an embodiment, the one or more second driver 472 may be attached to the substrate 410 or any other surface (not shown).

In a fourth embodiment, as shown in FIG. 7 a lower ferromagnetic core 430 is located in a cavity underneath the first semiconductor chip 440 and second semiconductor chip 442 and above the substrate 410. In an embodiment, the lower ferromagnetic core 430 is attached directly to substrate 410 by glue, non-conductive material 425 covering substrate 410, or any other means known in the art which causes the space shown between the lower ferromagnetic core 430 and substrate 410. In a fourth embodiment, as shown in FIG. 7, an upper ferromagnetic core 450 is mounted on top of the first semiconductor chip 440 and the second semiconductor chip 442. In an embodiment, a non-magnetic non-conductive material 447, for example, Kapton tape or glue, is located between at least some of the gap between the upper ferromagnetic core 450 and the lower ferromagnetic core 430 and/or the first semiconductor chip 440 and/or the second semiconductor chip 442. In an alternative embodiment, no materials exist between the upper ferromagnetic core 450 and the lower ferromagnetic core 430 and the semiconductor chip 440 causing there to be no air gap 445 (not shown). In an embodiment, the upper ferromagnetic core 450 is a double "U" shaped and inverted to have the three limbs of the double "U" facing downwards towards the lower ferromagnetic core 430. In an embodiment, the lower ferromagnetic core 430 and the upper ferromagnetic core 450 create a magnetic loop together around both the first semiconductor chip 440 and the second semiconductor chip 442. In an embodiment, an air gap 445 is located between the three limbs of the upper ferromagnetic core 450 and the lower magnetic core 430. In an embodiment, the lower ferromagnetic core 430 and the upper ferromagnetic core 450 may be, but is not limited to, a ferromagnetic metal, such as iron, or a ferrimagnetic compound such as ferrites. In an embodiment, the lower ferromagnetic core 330 and the upper ferromagnetic core 350 may be machined from a magnetic material. In an embodiment, the lower ferromagnetic core 430 and the upper ferromagnetic core 450 create one or more magnetic loops together.

Figure 8:
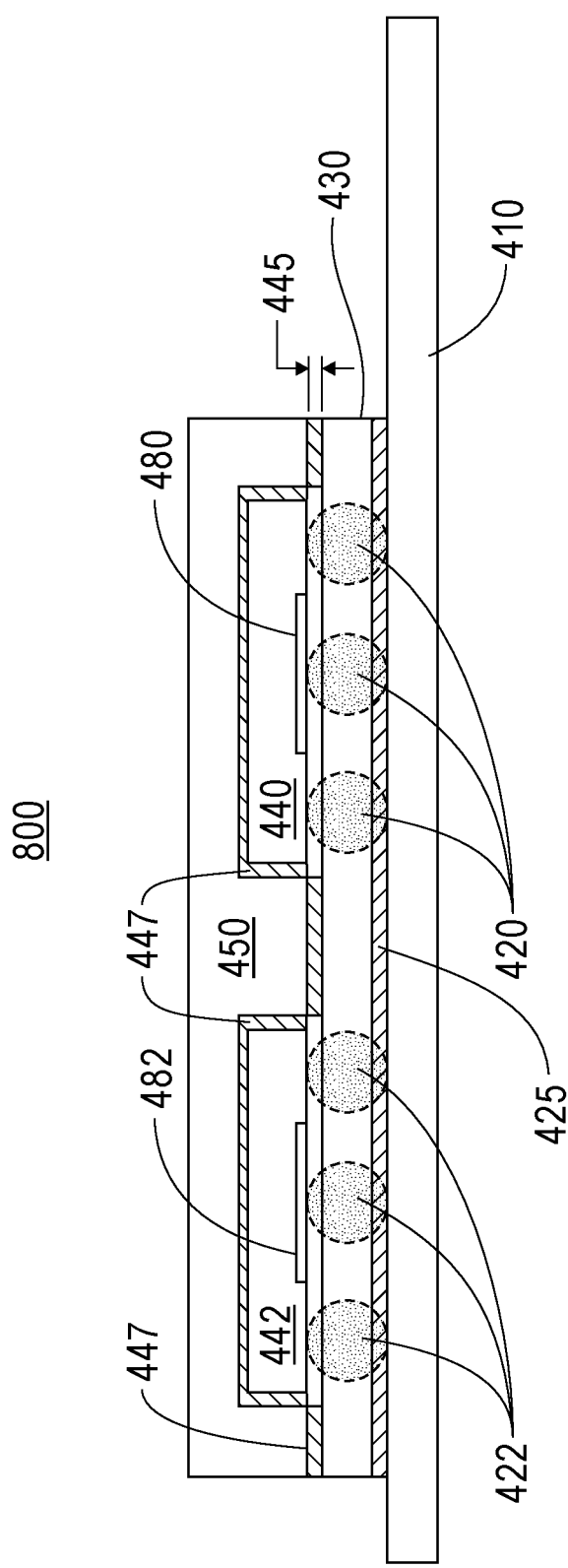
FIG. 8 is a pictorial representation (through a cross-sectional view) depicting the two semiconductor chips with chip-external magnetic cores of FIG. 7, generally designated 800, in accordance with a fourth embodiment of the invention.

Referring to FIG. 8 there is a pictorial representation (through a cross-sectional view) depicting the two semiconductor chips with chip-external magnetic cores of FIG. 7, generally designated 800, in accordance with a fourth embodiment of the invention. FIG. 8 depicts a substrate 410 attached to a first semiconductor chip 440 and a second semiconductor chip 442 via one or more solder ball(s) 420 and one or more solder ball(s) 422, respectively. In an embodiment, the two or more first on-chip metal winding 480 are located on a first side, or bottom, of the first semiconductor chip 440. In an embodiment, the two or more second on-chip metal winding 482 are located on a first side, or bottom, of the second semiconductor chip 442. In an embodiment, a lower ferromagnetic core 430 is located in a cavity underneath the first semiconductor chip 440 and second semiconductor chip 442 and above the substrate 410. In an embodiment, an upper ferromagnetic core 450 is mounted on top of the first semiconductor chip 440 and second semiconductor chip 442. In an embodiment, an air gap 445 is located between the three limbs of the upper ferromagnetic core 450 and the lower magnetic core 430. In an alternative embodiment, lower ferromagnetic core 430 may be in direct contact (not shown) with substrate 410.

It should be noted, each embodiment may include multiple semiconductor chips and chip-external magnetic cores. For example, in the first embodiment as shown in FIGS. 1 and 2, there may be two or more arrangements of the entire structure that is placed on substrate 110. Alternatively, in a second example, in the fourth embodiment as shown in FIGS. 7 and 8, there maybe two or more arrangements of the entire structure that is placed on substrate 410. It should be noted, there may be any physical setup of the chip-external magnetic cores, such as a single chip-external magnetic core, as shown in FIGS. 1-6 or two chip-external magnetic core, as shown in FIG. 7-8. Alternatively, there may be multiple single chip-external magnetic core on a substrate such as the physical setup of FIG. 1-6 is replicated more than once on a substrate. In an embodiment, any of the one or more on-chip metal winding found in any of the four embodiments are perpendicular with the lower ferromagnetic core and the upper ferromagnetic core.

What is claimed is:

1. A structure comprising:
a semiconductor chip connected to a substrate via one or more solder balls, wherein the semiconductor chip includes one or more on-chip metal winding;
a first ferromagnetic core, wherein the first ferromagnetic core is located below the semiconductor chip and above the substrate;
a second ferromagnetic core, wherein the second ferromagnetic core is located above the semiconductor chip; and
wherein the first ferromagnetic core and the second ferromagnetic core create a magnetic loop.

2. The structure of claim 1, wherein the semiconductor chip includes one or more on-chip metal winding.

3. The structure of claim 2, wherein the one or more on-chip metal winding are a first on-chip metal winding and a second on-chip metal winding.

4. The structure of claim 3, wherein the first on-chip metal winding is adjacent to the second on-chip metal winding.

5. The structure of claim 3, wherein the first on-chip metal winding is located below the second on-chip metal winding.

6. The structure of claim 2, wherein the one or more on-chip metal winding are perpendicular with the first ferromagnetic core and the second ferromagnetic core.

7. The structure of claim 2, wherein the one or more on-chip metal winding are a metal.

8. The structure of claim 2, wherein the on-chip metal winding are selected from the group consisting of contacts (pads), interconnect wires, visa and dielectric structures.

9. The structure of claim 1, wherein an air gap exists between the first ferromagnetic core and the second ferromagnetic core.

10. The structure of claim 1, wherein the first ferromagnetic core is glued to the substrate.

11. The structure of claim 1, where in the first ferromagnetic core is made of a ferromagnetic metal or a ferrimagnetic compound.

12. The structure of claim 1, wherein the second ferromagnetic core is made of a ferromagnetic metal or a ferrimagnetic compound.

13. The structure of claim 1, wherein the first ferromagnetic core is machined from a magnetic material.

14. The structure of claim 1, wherein the second ferromagnetic core is machined from a magnetic material.

15. The structure of claim 1, wherein the second ferromagnetic core is "U" shaped.

16. A structure comprising:
a first semiconductor chip connected to a substrate via one or more solder balls, wherein the first semiconductor chip includes one or more on-chip metal winding;
a second semiconductor chip connected to a substrate via one or more solder balls, wherein the second semiconductor chip includes one or more on-chip metal winding;
a first ferromagnetic core, wherein the first ferromagnetic core is located below the first semiconductor chip, below the second semiconductor chip, and above the substrate;
a second ferromagnetic core, wherein the second ferromagnetic core is located above the first semiconductor chip and the second semiconductor chip; and
wherein the first ferromagnetic core and the second ferromagnetic core create one or more magnetic loops.

17. The structure of claim 16, wherein the second ferromagnetic core is double "U" shaped.

18. The structure of claim 17, wherein the one or more on-chip metal winding are a metal.

19. The structure of claim 17, wherein the one or more on-chip metal winding are perpendicular with the first ferromagnetic core and the second ferromagnetic core.

20. The structure of claim 16, wherein the first semiconductor chip includes one or more on-chip metal winding and the second semiconductor chip includes one or more on-chip metal winding.

* * * * *